(12) United States Patent
Greiner et al.

(10) Patent No.: US 9,659,126 B2
(45) Date of Patent: May 23, 2017

(54) MODELING PATTERN DEPENDENT EFFECTS FOR A 3-D VIRTUAL SEMICONDUCTOR FABRICATION ENVIRONMENT

(71) Applicant: COVENTOR, INC., Cary, NC (US)

(72) Inventors: Kenneth B. Greiner, Arlington, MA (US); David M. Fried, South Salem, NY (US); Mattan Kamon, Arlington, MA (US); Daniel Faken, Peabody, MA (US)

(73) Assignee: Coventor, Inc., Cary, NC (US)

( * ) Notice: Subject to any disclaimer, the term of this patent is extended or adjusted under 35 U.S.C. 154(b) by 0 days.

(21) Appl. No.: 14/605,523

(22) Filed: Jan. 26, 2015

(65) Prior Publication Data

US 2015/0213176 A1    Jul. 30, 2015

Related U.S. Application Data

(60) Provisional application No. 61/931,638, filed on Jan. 26, 2014.

(51) Int. Cl.
*G06F 17/50* (2006.01)

(52) U.S. Cl.
CPC ...... *G06F 17/5068* (2013.01); *G06F 17/5009* (2013.01)

(58) Field of Classification Search
CPC ................ G06F 17/5009; G06F 17/5068
See application file for complete search history.

(56) References Cited

U.S. PATENT DOCUMENTS

| 6,116,766 A | 9/2000 | Maseeh et al. |
| 2005/0076322 A1* | 4/2005 | Ye .................. G03F 7/705 716/52 |

(Continued)

FOREIGN PATENT DOCUMENTS

KR    20120101207 A    9/2012

OTHER PUBLICATIONS

Schropfer et al., "Novel 3D modeling methods for virtual fabrication and EDA compatible design of MEMS via parametric libraries", Journal of Mocromechanics and Microengineering, vol. 20, No. 6 (2010).

*Primary Examiner* — Vuthe Siek
(74) *Attorney, Agent, or Firm* — McCarter & English, LLP; John S. Curran

(57) ABSTRACT

Improving semiconductor device fabrication by enabling the identification and modeling of pattern dependent effects of fabrication processes is discussed. In one embodiment a local mask is generated from a 3-D model of a semiconductor device structure that was created in a 3-D virtual semiconductor fabrication environment from 2-D design layout data and a fabrication process sequence. The local mask is combined with a global mask based on the original design layout data to create a combined mask. The combined mask is convolved with at least one proximity function to generate a loading map which may be used to modify the behavior of one or more processes in the process sequence. This behavior modification enables the 3-D virtual semiconductor fabrication environment to deliver more accurate 3-D models that better predict the 3-D device structure when performing the virtual semiconductor device fabrication that serves as a prelude to physical fabrication.

28 Claims, 13 Drawing Sheets

(56) References Cited

U.S. PATENT DOCUMENTS

| | | | |
|---|---|---|---|
| 2008/0216027 A1 | 9/2008 | White et al. | |
| 2010/0315614 A1* | 12/2010 | Hansen | G03F 7/70125 355/67 |
| 2011/0231804 A1 | 9/2011 | Liu et al. | |
| 2012/0269421 A1* | 10/2012 | Ye | G03F 7/705 382/144 |
| 2013/0332894 A1* | 12/2013 | Ye | G03F 7/705 716/56 |

* cited by examiner

MODELING PATTERN DEPENDENT EFFECTS FOR A 3-D VIRTUAL SEMICONDUCTOR FABRICATION ENVIRONMENT

RELATED APPLICATION

This application is related to, and claims the benefit of, U.S. Provisional Patent Application No. 61/931,368 entitled "Modeling Pattern Dependent Effects for a 3-D Virtual Semiconductor Fabrication Environment", filed Jan. 26, 2014, the contents of which are incorporated herein by reference in their entirety.

BACKGROUND

Semiconductor development organizations at integrated device manufacturers (IDMs) and independent foundries spend significant resources developing the integrated sequence of process operations used to fabricate the chips (integrated circuits (ICs)) they sell from wafers ("wafers" are thin slices of semiconductor material, frequently, but not always, composed of silicon crystal). Large portions of these resources are spent on fabricating experimental wafers and associated measurement, metrology ("metrology" refers to specialized types of measurements conducted in the semiconductor industry) and characterization structures, all for the purpose of ensuring that the integrated sequence of processes produces the desired semiconductor device structures. These experimental wafers are used in a trial-and-error approach to develop individual processes for the fabrication of a device structure and also to develop the total, integrated process flow. Due to the increasing complexity of advanced technology node process flows which can include large numbers of processes, a large portion of the experimental fabrication runs result in negative or null characterization results. These experimental runs are long in duration, weeks to months in the "fab" (fabrication environment), and expensive, as each experimental wafer may cost thousands of dollars. Recent semiconductor technology advances, including FinFET, TriGate, High-K/Metal-Gate, embedded memories and advanced patterning, have dramatically increased the complexity of integrated semiconductor fabrication processes. The cost and duration of technology development using this trial-and-error experimental methodology has concurrently increased.

A virtual fabrication environment for semiconductor device structures offers a platform for performing semiconductor process development at a lower cost and higher speed than is possible with conventional trial-and-error physical experimentation. A virtual fabrication environment is capable of virtually modeling an integrated process flow and predicting the complete 3-D structures of all devices and circuits that comprise a full technology suite. Virtual fabrication can be described in its most simple form as combining a description of an integrated process sequence with a subject design, in the form of 2D design data (masks or layout), and producing a 3-D structural model that is predictive of the result expected from a real/physical fabrication run. A 3-D structural model includes the geometrically accurate 3-D shapes of multiple layers of materials, implants, diffusions, etc. that comprise a chip or a portion of a chip. Virtual fabrication is done in way that is primarily geometric, however the geometry involved is instructed by the physics of the fabrication processes. By performing the modeling at the structural level of abstraction (rather than physics-based simulations), construction of the structural models can be dramatically accelerated, enabling full technology modeling, at a circuit-level area scale. The use of a virtual fabrication environment thus provides fast verification of process assumptions, and visualization of the complex interrelationship between the integrated process sequence and the 2D design data.

BRIEF SUMMARY

Embodiments of the present invention improve semiconductor device fabrication by enabling the identification and modeling of pattern dependent effects of fabrication processes. In one embodiment a local mask is generated from a 3-D model of a semiconductor device structure that was created in a 3-D Virtual Semiconductor Fabrication Environment from 2-D design layout data and a fabrication process sequence. The local mask is combined with a global mask based on the original design layout data in order to create a combined mask. Because the 3-D model represents feature sizes and shapes more accurately than the design data, the local mask extracted from the 3-D model provides more accurate pattern density information for that part of the combined mask than would otherwise be available. The use of the global mask in the combined mask allows pattern dependence effects with length scales greater than the 3-D model dimensions to be modeled. The combined mask is convolved with at least one proximity function to generate a process behavior (loading) map which may be used to modify the behavior of one or more processes in the process sequence. This behavior modification enables the 3-D Virtual Semiconductor Fabrication Environment to deliver more accurate 3-D models that better predict the 3-D device structure when performing the virtual semiconductor device fabrication that serves as a prelude to physical fabrication.

In an embodiment, a computer-implemented method for identifying and modeling pattern dependent effects in a 3-D virtual semiconductor device fabrication environment includes generating a 2-D local mask from a 3-D model of a semiconductor device structure and combining a global mask corresponding to 2D design layout data with the local mask to create a combined mask. The method also convolves at least one proximity function with the combined mask to create at least one convolved mask and creates a loading map using the at least one convolved mask. The loading map is indicative of process behavior for a pattern dependent modeling step for virtual semiconductor device fabrication that varies as a result of one or more of pattern density, feature size or aspect ratio dependence. Additionally, the method executes an algorithm to model the pattern dependent modeling step and the behavior of the algorithm is altered based on the loading map.

In another embodiment, a computer-implemented method for identifying and modeling pattern dependent effects in a 3-D virtual semiconductor device fabrication environment includes receiving 2D design layout data and a fabrication process sequence for a semiconductor device structure. The fabrication process sequence includes a pattern dependent process step that includes a pattern dependence relation. The method also builds, during a virtual fabrication run to virtually fabricate the semiconductor device structure, a 3-D model of a semiconductor device structure by executing the process sequence up until the pattern dependent process step and generates a 2-D local mask from the 3-D model of a semiconductor device structure built by executing the process sequence up until the pattern dependent process step. Additionally, the method convolves at least one proximity function with the local mask to create at least one convolved local mask and convolves at least one proximity function with a global mask based on 2D design layout data to create at least one convolved global mask. The method also creates a loading map using the convolved local and global masks. The loading map is indicative of process behavior for a pattern dependent modeling step for virtual semiconductor device fabrication that varies as a result of one or more of pattern density, feature size or aspect ratio dependence. An algorithm is executed to model the pattern dependent modeling step and the behavior of the algorithm is altered based on the loading map. The method also executes a remainder of the process sequence following the pattern dependent modeling step to complete the build of the 3-D model of the semiconductor device structure.

In another embodiment, a computer-implemented method for identifying and modeling pattern dependent effects in a 3-D virtual semiconductor device fabrication environment includes receiving 2D design layout data and a fabrication process sequence for a semiconductor device structure. The fabrication process sequence includes a pattern dependent process step that includes a pattern dependence relation. The method also builds, during a virtual fabrication run to virtually fabricate the semiconductor device structure, a 3-D model of a semiconductor device structure by executing the process sequence up until the pattern dependent process step and generates a 2-D local mask from the 3-D model of a semiconductor device structure built by executing the process sequence up until the pattern dependent process step. Additionally, the method combines a global mask corresponding to the 2D design layout data with the local mask to create a combined mask and convolves at least one proximity function with the combined mask to create at least one convolved mask. The method also creates a loading map using the at least one convolved mask, the loading map indicative of process behavior for the pattern dependent modeling step that occurs as a result of one or more of pattern density, feature size or aspect ratio dependence. The method executes an algorithm to model the pattern dependent modeling step and the behavior of the algorithm is altered based on the loading map. The method also executes a remainder of the process sequence following the pattern dependent modeling step to complete the build of the 3-D model of the semiconductor device structure.

BRIEF DESCRIPTION OF THE DRAWINGS

The accompanying drawings, which are incorporated in and constitute a part of this specification, illustrate one or more embodiments of the invention and, together with the description, help to explain the invention. In the drawings.

DETAILED DESCRIPTION

Many individual processes used in semiconductor device fabrication show effects that vary as a function of "pattern density", where pattern density refers to the size and/or proximity of features in the device design. These process effects, known as "pattern-dependent effects", are an important source of total process variation in state-of-the-art semiconductor technologies. Fabrication processes may exhibit pattern dependence over a variety of length scales. Some fabrication processes exhibit variation in behavior which is influenced by pattern density over a very large area of the design ("long length-scale"), while other processes exhibit variation in behavior due to very local pattern density ("short length-scale"). Examples of long length-scale pattern-dependent effects include Chemical-Mechanical Polishing, which can have dishing (or over-polish) effects that depend on the underlying topography over hundreds of microns. Examples of short length-scale pattern-dependent effects include etches whose depth depends on the area of the opening.

For process modeling, etch processes are often the most complex with respect to pattern-dependent effects, as they can exhibit many different effects with many different length scales. Often etch depth can depend on feature-scale effects like mask opening area, local effects like pattern density, and global wafer-scale effects such as positional dependence of the die on wafer. Due to this complexity, and the inherent importance of etch processes on the structural integrity of semiconductor technologies, understanding and modeling of etch pattern-dependence is essential for proper structural modeling.

Figure 1:
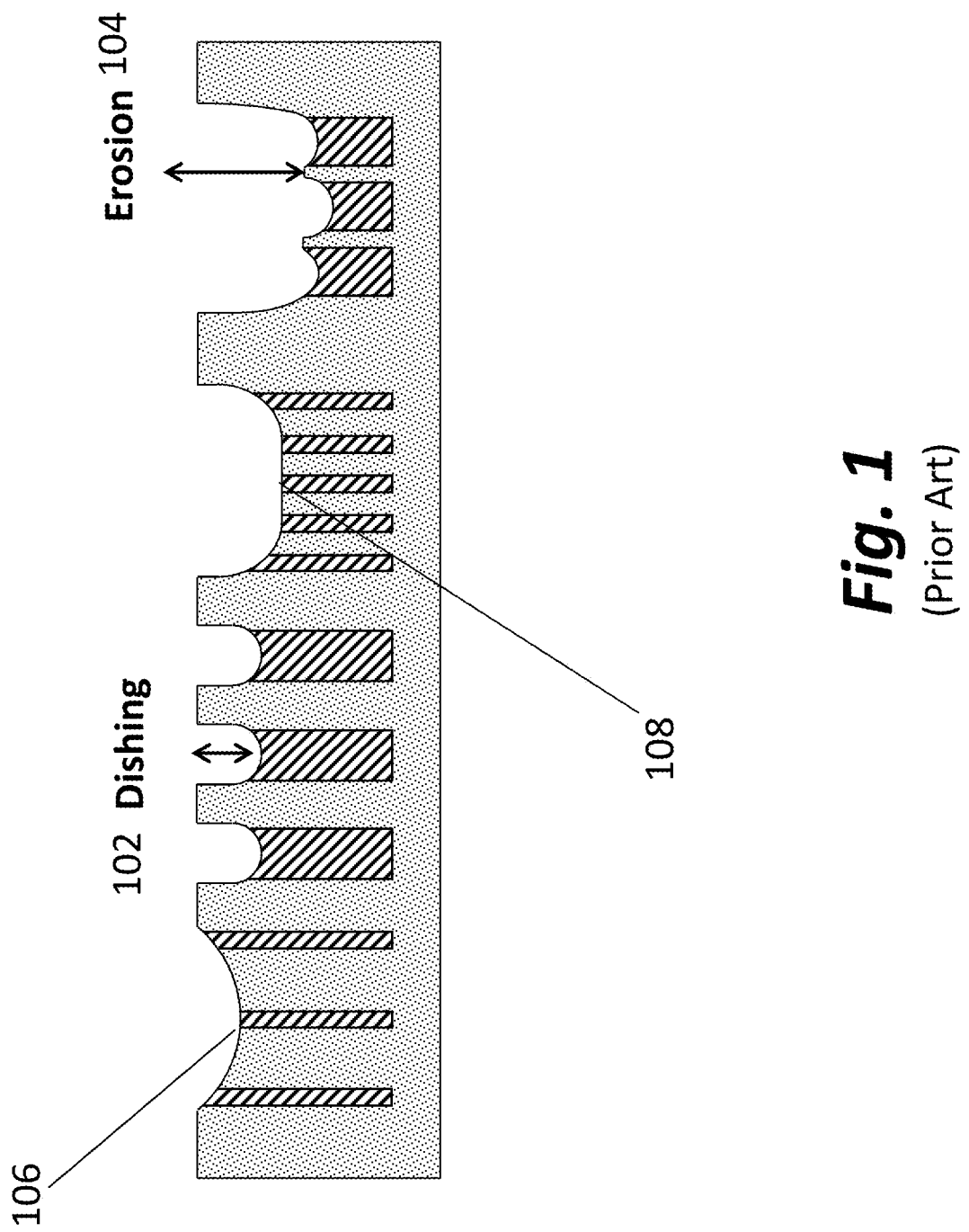
FIG. 1 (prior art) depicts an example of pattern dependent effects in chemical mechanical polishing.

For example, FIG. 1 depicts an example of pattern dependent effects in chemical mechanical polishing. The effect of dishing 102 where a wide line combines with a wide space and erosion 104 where a wide line combines with a fine space are examples of chemical-mechanical polishing which will have different effects based on a large area of the underlying topography. Other effects of chemical-mechanical polishing where the topography features a fine line and wide space 106 and fine line and fine space 108 are also depicted with their varying results. It will be noted that chemical-mechanical polishing results in deeper erosion when the polishing is performed on an area with a wide line and fine space versus the shallower dishing effect 102 where the topography features both a wide line and wide space.

Figure 2:
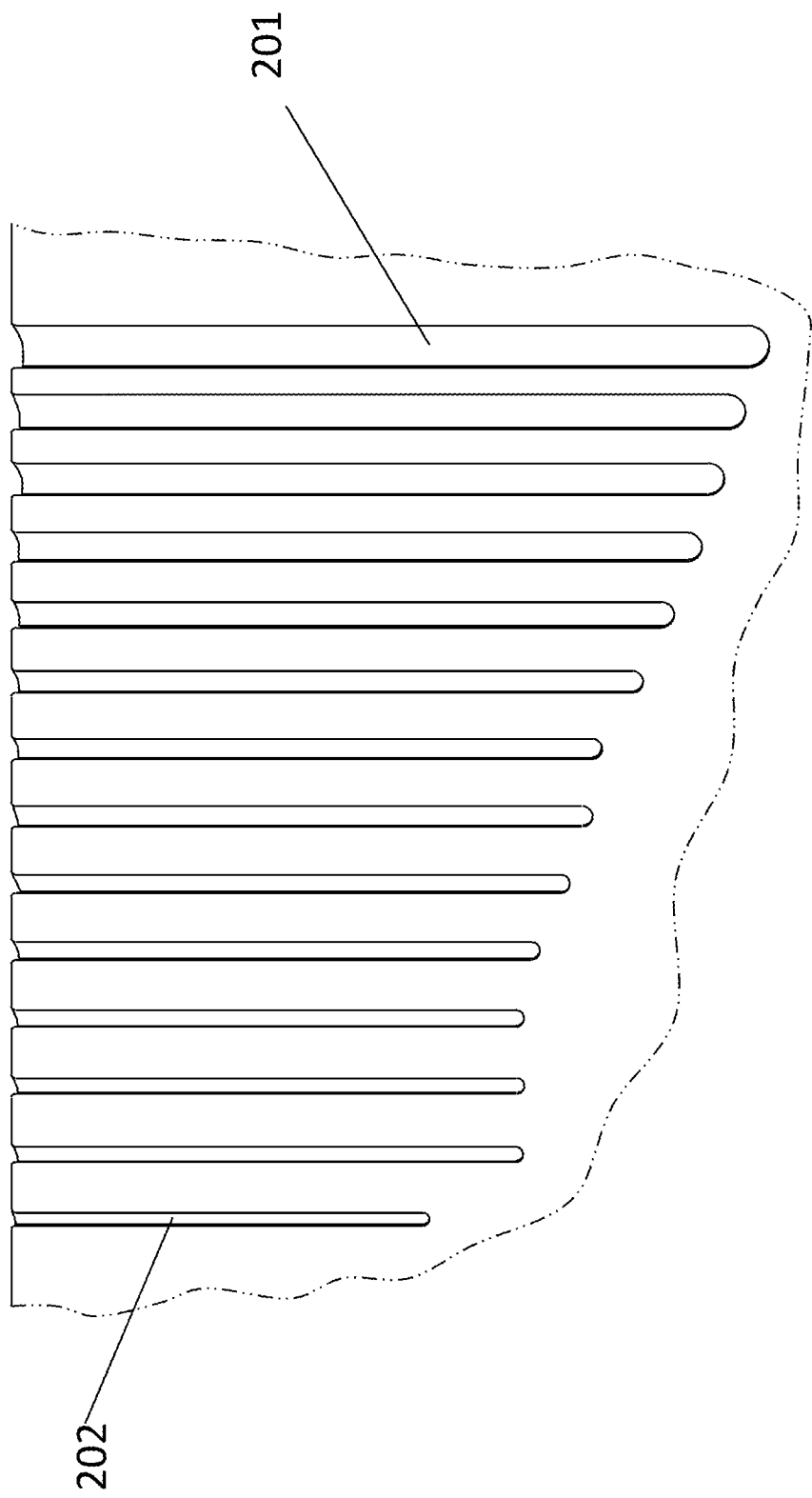
FIG. 2 (prior art) depicts an example of etch pattern dependence where an etch rate varies with feature size.
Figure 3:
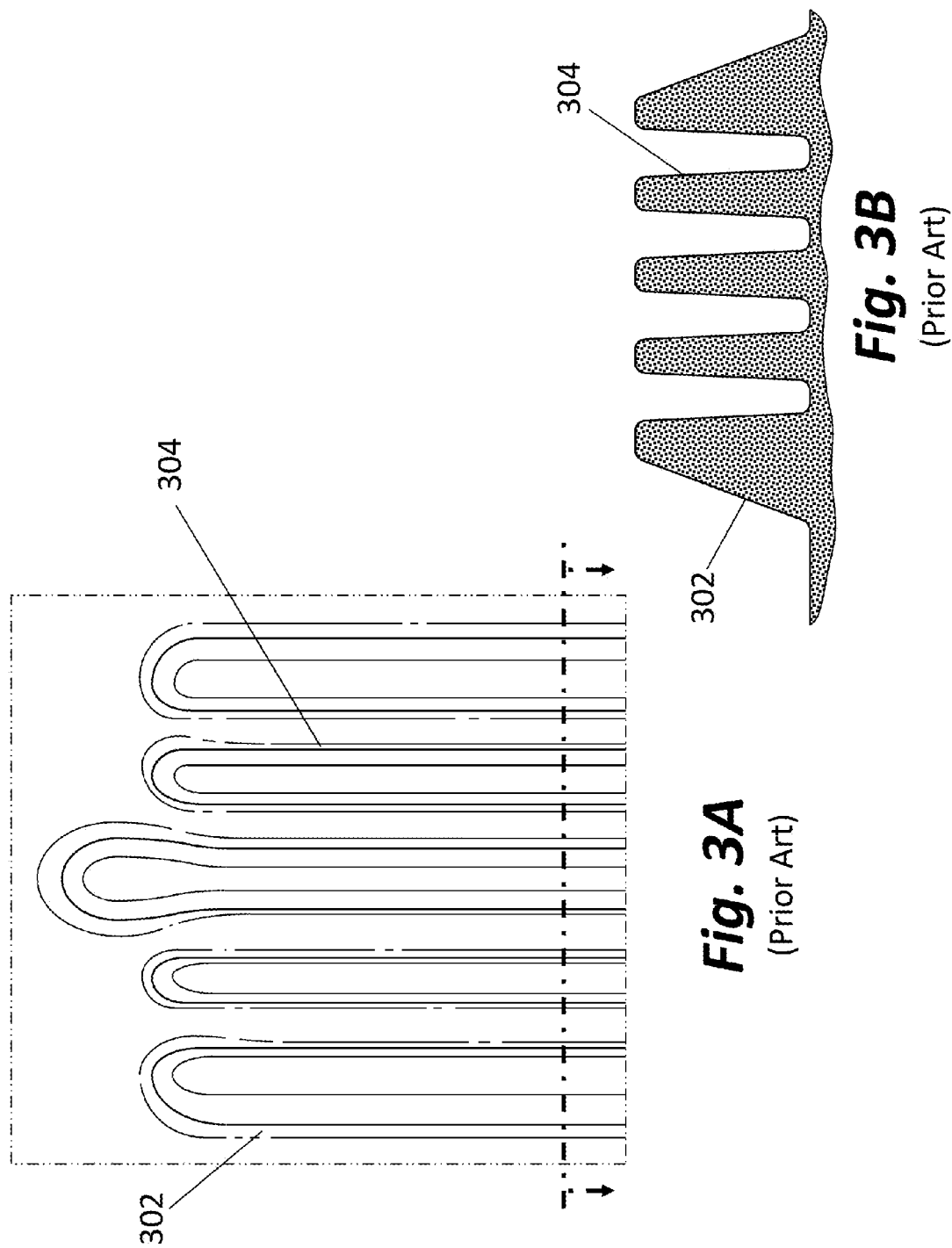
FIGS. 3A-B (prior art) depict an example of etch pattern dependence where an etch profile depends on pattern density.

In contrast to FIG. 1, some pattern dependent effects depend on short-range, local pattern density. For example, FIG. 2 depicts an example of etch pattern dependence where an etch rate varies with feature size and the difference in etch rates results in varying feature depth. This is often called "aspect ratio dependent etch" or Aspect Ratio Dependent Etching (ARDE). Typically, features that are much deeper than they are wide are said to display a high aspect ratio and will exhibit a slower etch rate. For example, in FIG. 2, the etch feature 201 is larger, hence has a lower aspect ratio and etches faster. Feature 202 is very small, hence has a high aspect ration and etches more slowly. An additional class of pattern dependent process behavior results in variation in feature profile (rather than depth or rate) as a function of pattern density. For example, FIGS. 3A-B depicts an example of etch pattern dependence where an etch profile (such as a taper angle, lateral etch rate, etc.) depends on pattern density. As can be seen in FIG. 3, the pattern dependence effect results in the sidewall angle 302 being shallower at the boundaries of the array as opposed to the middle of the array 304.

One challenge to modeling pattern dependent effects well in a 3-D Virtual Semiconductor Fabrication Environment relates to the length-scale differences between these pattern dependent effects and the size of typical 3-D models. Usually, the layout areas (or domain boundary) used for 3-D models are large enough to encompass the short length-scale effects, but too small to accurately represent larger length-scale effects. Embodiments of the present invention address this issue by extracting pattern information from both a larger design layout mask and from the 3-D model. The 3-D model contains a very accurate representation of a structure being etched (as it is based on information from both the 2-D design layout data and the process sequence used to produce the modeled semiconductor device structure), and therefore can provide very detailed pattern density and feature size information for the portion of the design represented in the model. However, some pattern dependence effects occur over length-scales much larger than the area represented in the 3-D model and so the embodiments of the present invention supplement the information from the 3-D model with pattern information from a design layout mask. Since layout masks cover a large area (often an entire chip) they contain the long-range information required to properly account for the large-scale pattern-dependent effects. As used herein, the design layout mask is also referred to as a "global mask" while a mask generated from the 3-D model is referred to as a "local mask".

In one embodiment, a local mask is extracted from the detailed structural 3-D model representing the etchable areas (features) on the device in the layout area local to the 3-D model. This extracted local mask is combined with a larger global mask from the design layout which covers a larger area than the 3-D model (but lacks process information) to create a combined mask. Extracting masking information from the 3-D model ensures that the combined pattern dependence mask exactly matches the geometry of the 3-D model. To extract mask information from the 3-D model, the 3-D model surface is projected on to the X-Y plane. Areas occupied by etchable materials are marked as "open" on the mask, whereas areas occupied by non-etchable materials or masking materials are marked as "masked" or "closed" on the mask. The mask information obtained by this method is only present within the (x,y) bounds of the 3-D model, and is overlaid over the layout (global) mask to create the final combined (pattern dependence) mask. It should be appreciated that the distinction between etchable and masking materials may vary depending on implementation. Etches typically attack all exposed materials, with some materials etching faster or slower due to specific etch process parameters. The identification of masking materials is typically done by the user, but may also be performed by the virtual fabrication system based on relative etch rates defined by the user. It should also be appreciated that alternative techniques for extracting a local mask are possible, for example, by using an elevation criteria where areas of the model which contain any material above an elevation threshold are marked as closed (masked) in the local mask.

Figure 4:
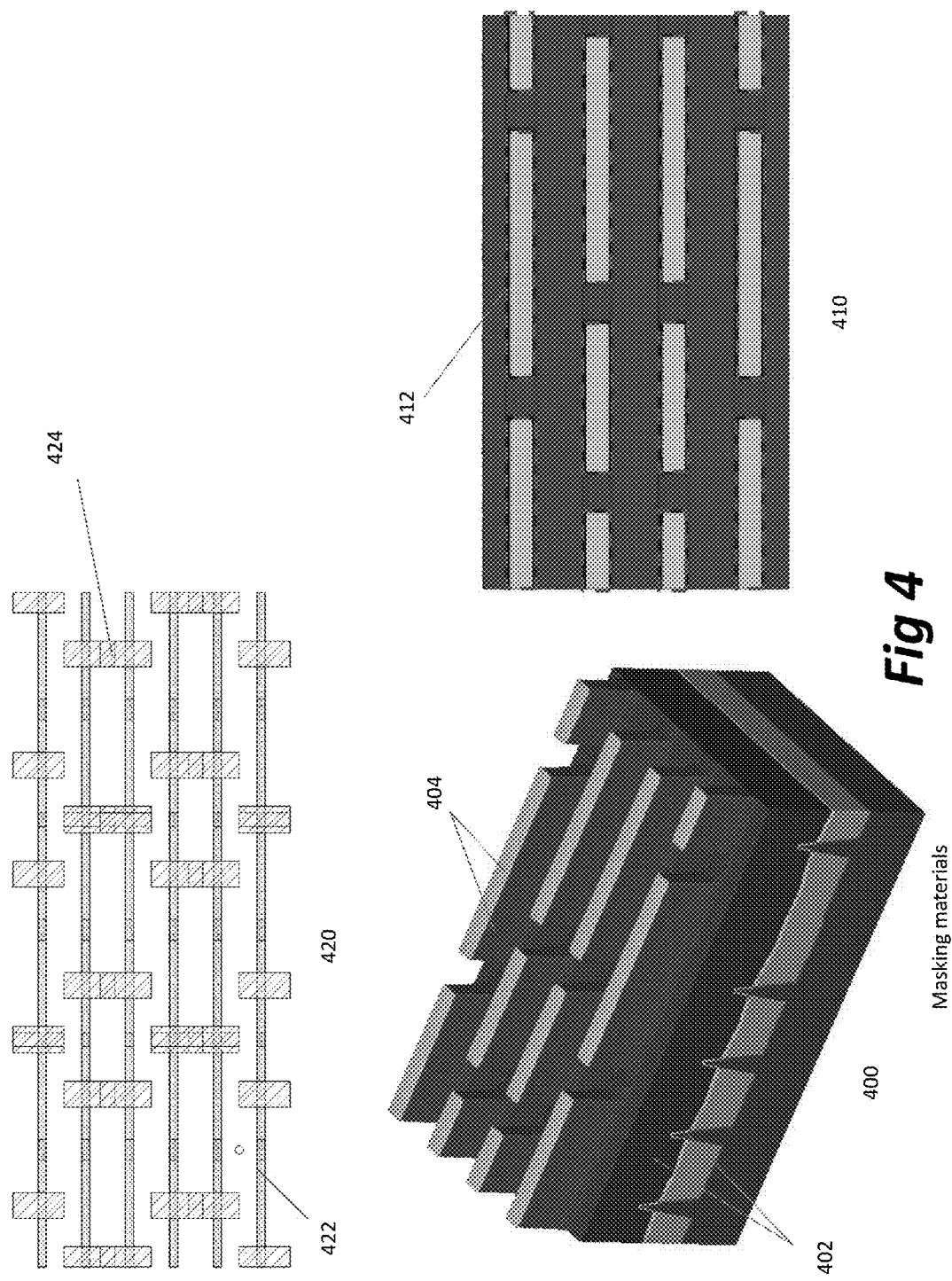
FIG. 4 depicts an exemplary 3-D model and design masks used in an embodiment of the present invention.

FIG. 4 depicts an exemplary 3-D model from which the local mask may be extracted. The 3-D model 400 contains several etchable materials (402) and masking materials (404). A top down view of the 3-D model (410) shows the local mask 412 that may be extracted from the 3-D model 400 using the projection technique described above. By comparing the local mask 412 to the design masks (422 and 424) it will be noted that feature sizes and shapes obtained in this manner represent the on-wafer pattern density more accurately than the design mask. The 3-D model in this example is created using a double-patterning line-and-cut process, which combines two separate design masks to create features on the wafer. The size and shape of features in the resulting structure are altered by etch processes during the line-and-cut procedure and are not represented accurately in the design (global) mask.

Figure 5:
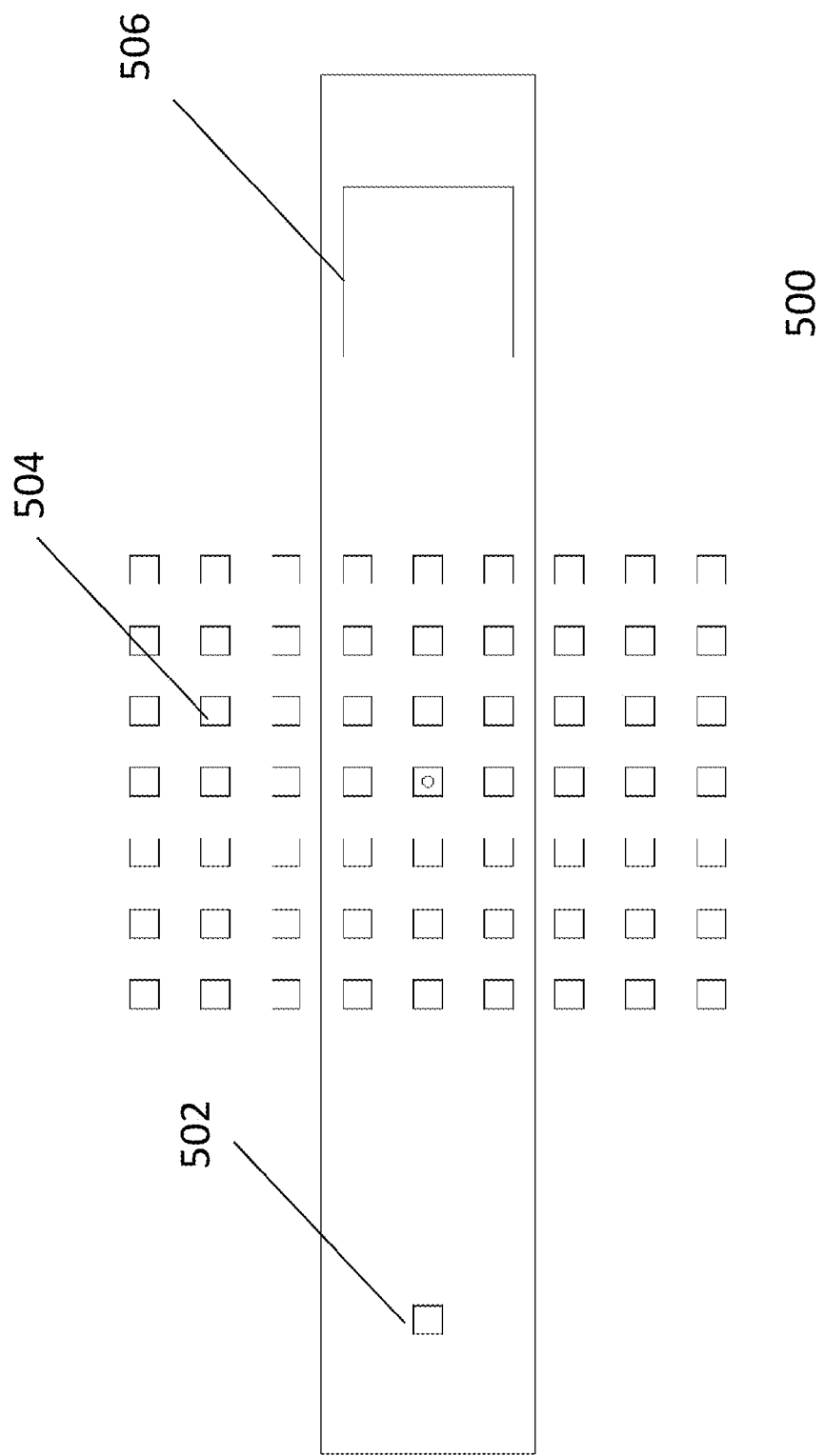
FIG. 5 depicts an exemplary global mask depicting layout data used in a pattern dependent etch in an embodiment of the present invention.
Figure 6:
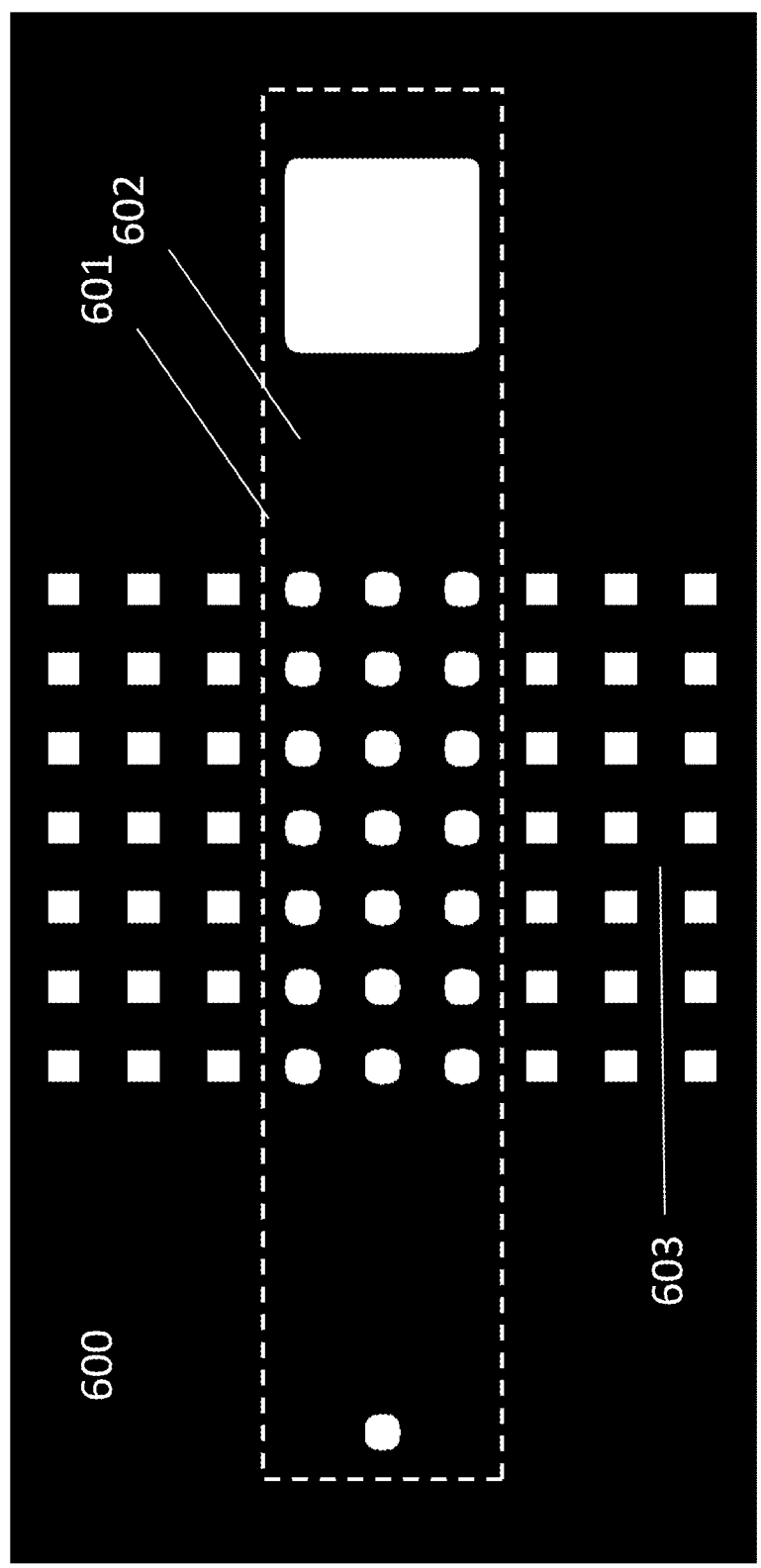
FIG. 6 depicts an exemplary combined mask for the layout of FIG. 5 combining local and global masking information in an embodiment of the present invention.

FIGS. 5-6 depict exemplary global and combined masks used by an embodiment of the present invention. FIG. 5 depicts an exemplary global mask depicting layout data used in a pattern dependent etch in an embodiment of the present invention. In FIG. 5, the global mask 500 includes layout data for (from left to right) a small isolated via 502, a dense array of small vias 504, and a large open etchable area 506. A via is a vertical, electrically conductive connector between two interconnect layers, also called metal layers, or a vertical connector between an interconnect layer and a device such as a transistor, resistor or capacitor.

FIG. 6 depicts an exemplary combined mask 600 combining the layout data of FIG. 5 and local mask information generated from a 3-D model in an embodiment of the present invention. The dashed box 601 represents the (x,y) boundaries of the 3-D model of a semiconductor device structure. Within the dashed box, local mask information 602 is extracted from the 3-D model. In one embodiment, the 3-D model surface may be projected on to a 2D plane holding the global mask in order to create the combined mask. Outside the dashed box, the information is supplied by the global mask 603 based on the overall design layout data. It should be noted that mask shapes differ between 602 and 603. Inside the bounds of the 3-D model (602), lithography modeling and processing effects have altered the features shapes. The rounded shapes shown in 602 more accurately reflect the real device structure and will provide superior pattern density and feature size information.

Once the combined mask which includes the local and global mask has been created, embodiments of the present invention then apply the concept of proximity functions or kernels. Proximity functions are used in Optical Proximity Correction (OPC) to predict pattern dependent process behavior for the purpose of correcting patterning masks. Due to the complex physics of many fabrication processes, attempting to model pattern dependent behavior using a first-principles approach is difficult and computationally expensive. To achieve reasonable computational performance, embodiments of the present invention utilize a phenomenological or "fitting" approach to modeling pattern dependence. In one embodiment, regardless of physical mechanism, pattern dependent effects are simply defined as a variation in process behavior as a function of open (unmasked) area within some characteristic distance of any position of interest on the semiconductor device structure being virtually fabricated. This unmasked area may be evaluated in the vicinity of any point of interest through the use of a simple 2-D sampling function, often called a "proximity function" or "proximity kernel".

For example, in one embodiment, the proximity function is a normalized two-dimensional Gaussian function:

$$p(\vec{x}) = \frac{1}{2\pi r^2} \exp\left(\frac{(x-x_0)^2}{2r^2}\right)$$

It should be appreciated that by varying the radius of the Gaussian, a variety of pattern dependence effects may be achieved. A small radius, on the order of the minimum expected feature size, enables characterization of aspect ratio dependence. A larger radius, spanning multiple features, enables the characterization of effects over a longer length scale. It will be recognized by those skilled in the art that there is considerable prior work in the use proximity functions to model semiconductor patterning effects. The many different types of physical effects that cause pattern dependent behavior are often modeled most accurately by different proximity functions. A paper by Sato et al., "Dry-etch proximity function for model-based OPC beyond 65-nm node", Data Analysis and Modeling for Process Control III, edited by Iraj Emami, Kenneth W. Tobin, Jr., Proc. of SPIE Vol. 6155, 615504, (2006), for example, evaluates the Gaussian proximity function described here, as well as a directional Gaussian and an angle-dependent directional Gaussian. For the purposes of the present invention, many 2-D proximity functions are acceptable.

In one embodiment, mathematical convolution of one or more proximity functions is performed with the combined local and global masks in order to generate a process behavior map (referred to herein as a "loading" map and discussed further below). Convolution is a mathematical technique familiar to those skilled in the art, and can be expressed in a very general form as follows:

$$(f*g)(t) = \int_{-\infty}^{\infty} f(\tau)g(t-\tau)d\tau$$

In the present invention, convolution occurs in 2D space and hence is expressed as a double integral:

$$(p*m)(\vec{x}) = \int\int_{-\infty}^{\infty} p(\vec{\tau})m(\vec{x}-\vec{\tau})dxdy$$

where p(x) is the proximity function, and m(x) is the combined local and global mask. The convolution integral may be evaluated through any number of standard techniques known to those skilled in the art, including but not limited to Fast Fourier Transform methods and direct discrete integral methods. It should be appreciated that evaluation of the convolution causes the proximity function to be evaluated at all points on the mask.

In one embodiment, to control how the proximity functions modify process behavior, the user may specify a pattern dependence relation. The pattern dependence relation is a linear combination of up to two proximity functions:

$$f(x,y) = c_0 + c_1[p_1(r_1)*M(x,y)](x,y) + c_2[p_2(r_2)*M(x,y)](x,y)$$

Where $c_0$, $c_1$, $c_2$ are constant coefficients chosen by the user, $r_1$, $r_2$ are proximity function radii chosen by the user, $p_1$ and $p_2$ are proximity functions, and M is the pattern dependence (combined) mask. Note the * operator here refers to the convolution operation defined above. The pattern dependence relation defines a "loading map" f(x), which scales the nominal process parameters to modify process behavior. For example, if etch rate is pattern dependent then:

$$\text{rate}(x,y,z) = \text{rate}_{nominal}(x,y,z)f(x,y)$$

Where $d_{nominal}$ is the (scalar) nominal etch depth. Here the loading map f(x,y) expresses the normalized etch depth, although as will be recognized by those skilled in the art, other normalizations are equally effective. It should be noted that the loading map is a 2-D function in x and y, while virtual fabrication behavioral parameters are typically evaluated at points in 3-D space on the surface of the device structure being modeled. The equation shown above dictates that the 3-D behavioral parameter value is evaluated at any point (x,y,z) using the loading map value at position (x,y).

It should be appreciated the embodiments of the present invention are not limited to the above-discussed proximity functions and pattern dependence relations and other proximity functions and pattern dependence relations may be used within the scope of the present invention. For example, the pattern dependence relation here uses linear terms, but quadratic or cubic terms may also be used, or any other scalar function that provides a suitable relationship between the convolved mask(s) and the loading map. Also, it should be understood that the pattern dependent relation specified and the fabrication process behavior affected in embodiments of the present invention may be process behavior other than etch behavior. For example, the proximity functions may be used to create a loading map that modifies chemical mechanical polishing or deposition behavior in a virtual fabrication process.

Figure 7:
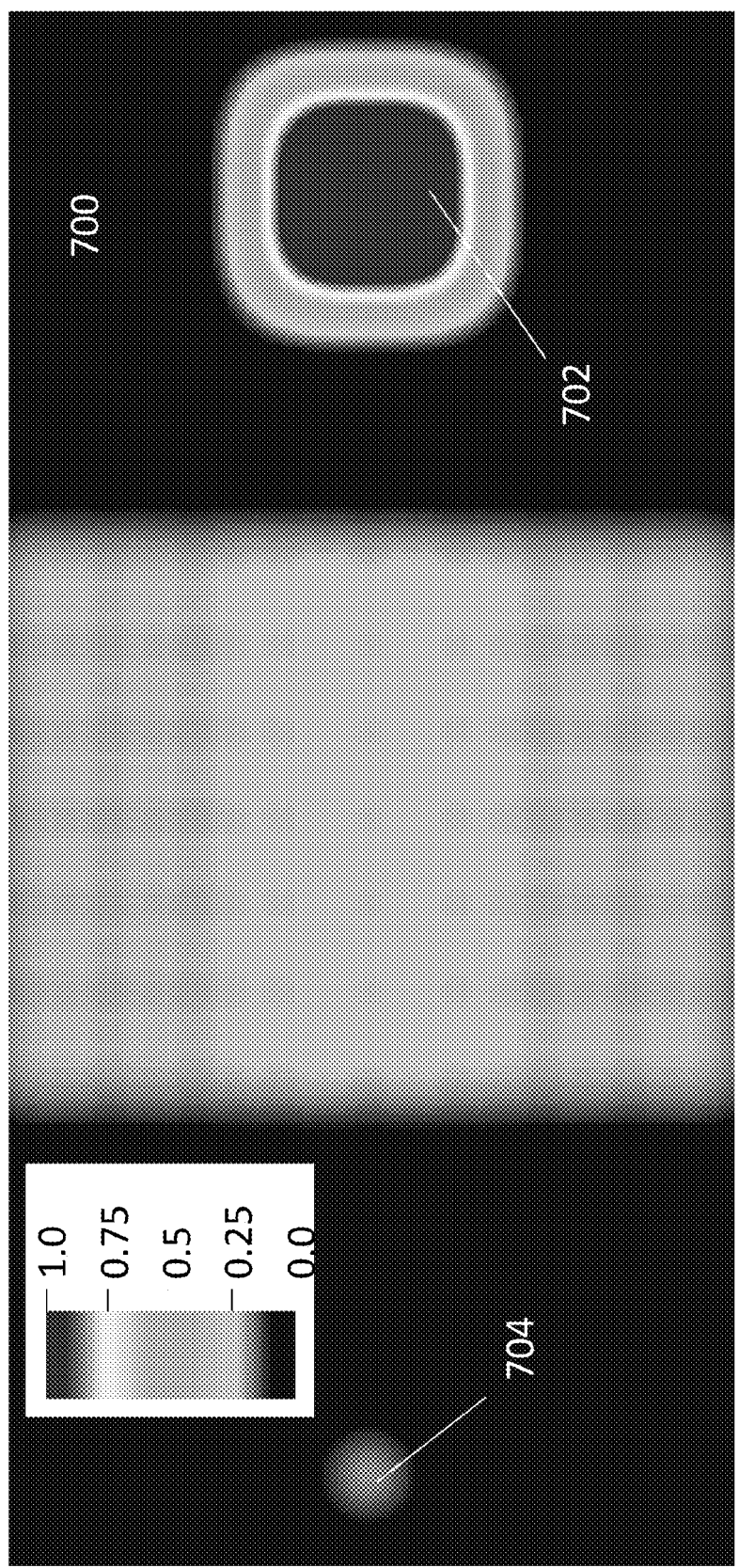
FIG. 7 depicts an exemplary loading map generated using the combined pattern dependence mask of FIG. 6 in an embodiment of the present invention.

FIG. 7 depicts an exemplary loading map generated from the pattern dependence mask of FIG. 6 in an embodiment of the present invention. The loading map is produced by convolving the pattern dependence mask (previous figure) with one or more proximity functions. The loading map modifies etch behavior such as etch rate, etch profile or aspect ratio dependence on the mask or wafer. As can be seen, the loading map 700 has its highest values in the large via 702 on the right, and smallest values in the small isolated via 704 on the left. In an embodiment of the present invention, the loading map may be used to modify the behavior of a predictive process modeling algorithm. For example, the loading map may be used to modify the behavior of a multi-etch algorithm in a predictive 3-D virtual semiconductor fabrication environment. Examples of a such a predictive 3-D virtual semiconductor fabrication environment and multi-etch algorithm are described in co-pending U.S. patent application Ser. No. 13/831,450, entitled "Multi-Etch Process Using Material-Specific Behavioral Parameters in 3-D Virtual Fabrication Environment", the contents of which are incorporated herein by reference in their entirety.

In such a 3-D virtual semiconductor fabrication environment, in one embodiment, a multi-etch process may be included in the process sequence which allows a 3-D modeling engine to model a wide-range of process and material-specific etch behavior. Patterning operations in process flows for highly-scaled semiconductor devices are frequently performed using plasma etches. Plasma etches are known by many different names: dry etch, reactive ion etch (RIE), inductively coupled plasma (ICP) etch, etc. A wide variety of operating conditions and chemistry allows process engineers to fine-tune plasma etch behavior to selectively achieve diverse etch physics in multiple different classes of materials. This behavioral flexibility is key to achieving a desired 3-D structure when patterning through several layers of material. Several different types of physics are typically involved, including but not limited to: chemical etching, sputtering, deposition or re-deposition of polymeric material, electrostatic charging, electrostatic focusing, and shadowing. This diverse spectrum of physics produces a commensurate range of etch behavior and hence structural shapes.

In one embodiment, the multi-etch algorithm whose behavior is to be modified through the use of the loading map uses a reduced set of behavioral parameters that are specific to the type of etch and the material being etched. This allows the capture of a wide range of physical etch behavior without the need to directly simulate the physics of the etch process. Four types of etch behavior that may be simulated include: isotropic, taper, sputtering and shadowing behavior.

Basic (isotropic) behavior is caused (physically) by chemical etching and results in material being removed at a similar rate in all directions from the point on the etchable surface, regardless of the local orientation of the etchable surface. Basic behavior may be modeled with a single input parameter, "lateral ratio", that controls the ratio between the lateral and vertical etch rates. For example, a lateral ratio value of one (1.0) indicates that the etch rate is uniform in all directions. A lateral ratio value less than one indicates that the etch rate in the lateral direction (on vertical surfaces) is slower than the etch rate in the vertical direction (on horizontal surfaces).

Taper behavior is caused (physically) by a combination of directional etch behavior and polymer deposition. The polymer deposition occurs as a side effect of a directional etch process. During a directional etch process that etches horizontal surfaces much faster than vertical surfaces, polymer may accumulate on near-vertical surfaces. This competition between etching and deposition results in tapered sidewall profiles. Taper behavior may be modeled with a single input parameter, the taper angle. A taper angle describes the critical angle at which deposition and etch rates are balanced. An optional second parameter, the lateral ratio, has the same meaning as defined above for basic behavior.

Sputter behavior refers to direct physical removal of material through bombardment by energetic ions and results in preferential removal of protruding edges (convex edges) and in some cases corners. Sputtering may be modeled with two parameters: the angle of maximum sputter yield, and the rate of sputter relative to the rate of vertical etching.

Shadowing refers to a reduction in directional ion flux caused by a local elevation change, effectively reducing etch rates for some structures. This effect can be significant in some cases, resulting in differing etch rates across a cell. Shadowing may be modeled using a single parameter to describe angle of incidence of the energetic ions relative to a vertical axis.

In an embodiment of the present invention, the loading map generated by convolving the proximity functions(s) and the combined mask is used to alter the behavior of a multi-etch process or other fabrication process in the 3-D Virtual Semiconductor Fabrication Environment. It should be noted that that a virtual fabrication process sequence may contain any number of pattern dependent process steps with the behavior of each patter-dependent step being modified by a separate loading map. For each pattern dependent step to be modeled, the local mask is extracted from the 3-D model geometry created by the fabrication process at that point in the fabrication sequence. In other words, the local mask is created from the 3-D structure that would exist in the real (physical) fabrication process during the pattern dependent process step.

Figure 8:
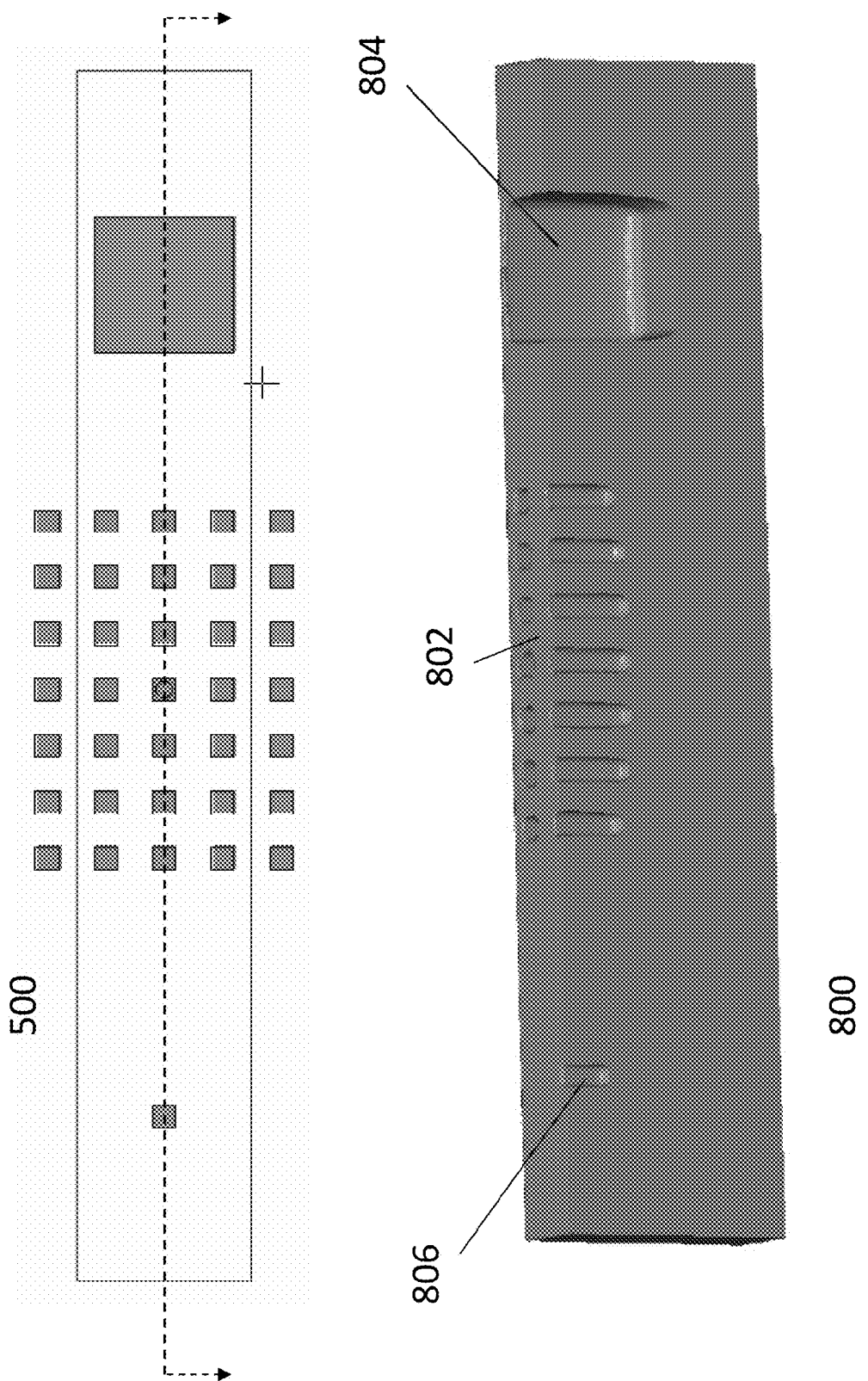
FIG. 8 depicts an exemplary 3-D model build based on the calibration layout data of FIG. 5 and the loading map of FIG. 7 in an embodiment of the present invention.

FIG. 8 depicts an exemplary 3-D model build 800 based on the global mask calibration layout data 500 of FIG. 5 and the loading map 700 of FIG. 7 in an embodiment of the present invention. The top FIG. 500 is the layout, showing cross-section location. The bottom FIG. 800 is a cross-section through the 3-D model. It should be noted that etch depths matches the loading map from FIG. 7 and the realistic variation in etch depth across the via array 802, in addition to large variation in edge depth between the large via 804 and small isolated via 806.

Figure 9:
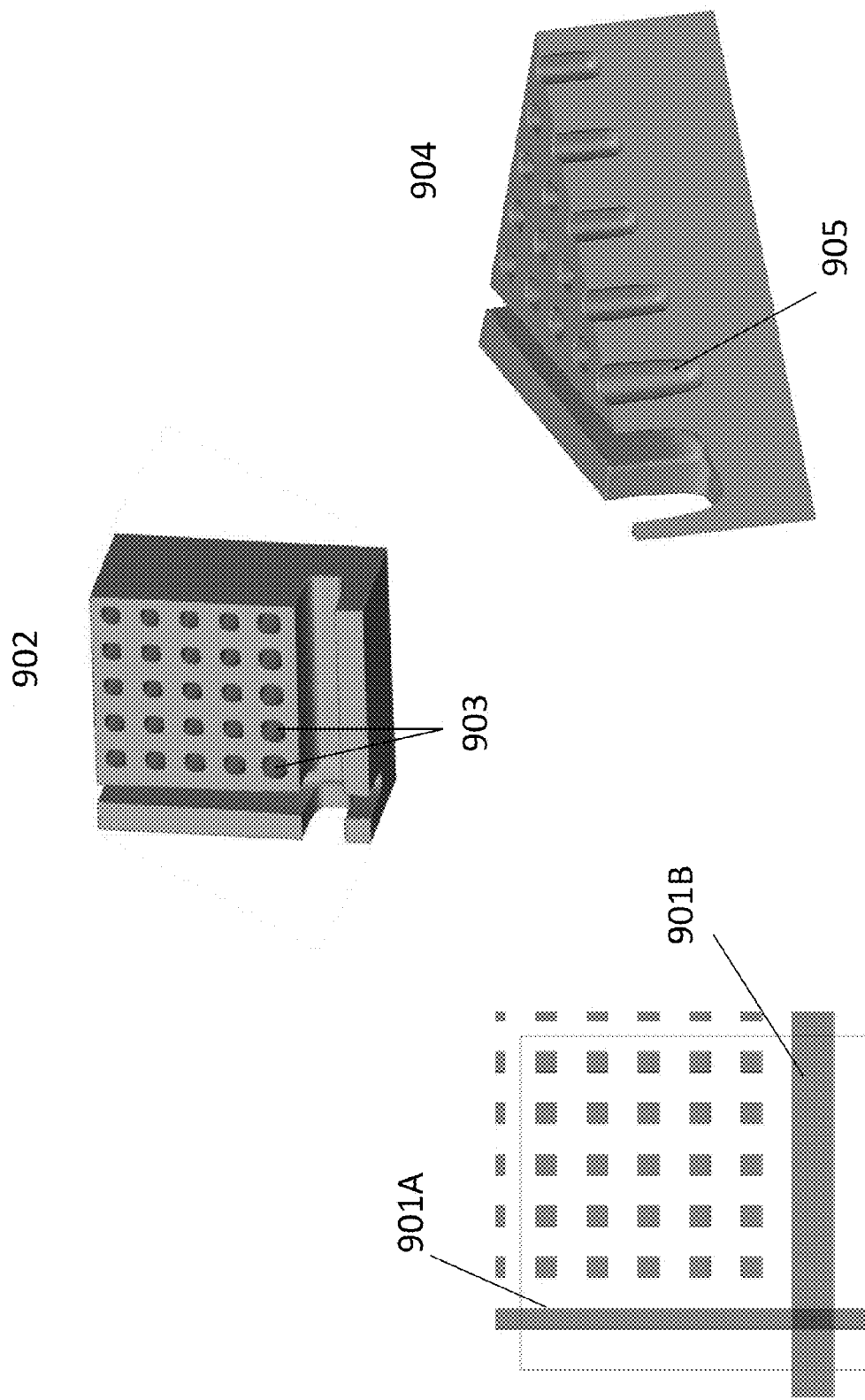
FIG. 9 depicts an exemplary use of predicted pattern dependent etch behavior in an embodiment of the present invention.

FIG. 9 depicts another exemplary use of predicted pattern dependent etch behavior in an embodiment of the present invention. Once calibrated on a first layout, the pattern dependent etch model can be applied to a more complex layout (left) 900, containing an array of vias close to two larger trenches 901A and 901B. The presence of the trenches increases the local pattern density, resulting in increased feature size or etch bias 903 depicted in the center model 902 and etch depth 905 in nearby vias as depicted in model 904.

Figure 10:
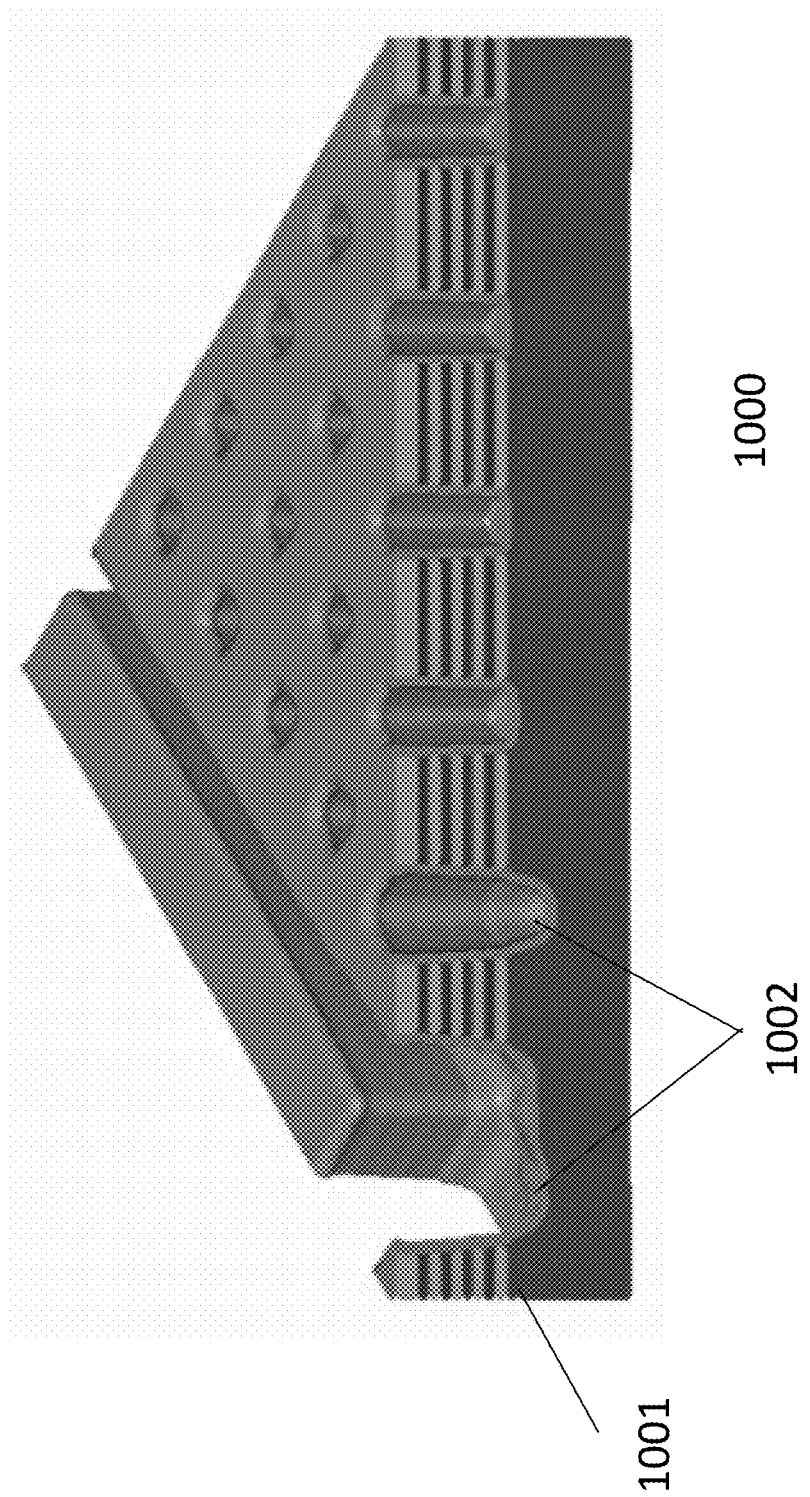
FIG. 10 depicts an additional exemplary use of predicted pattern dependent etch behavior in an embodiment of the present invention.

FIG. 10 depicts an additional exemplary use of predicted pattern dependent etch behavior in an embodiment of the present invention. When the calibrated pattern dependent etch model is further applied to a more complex structure 1000, it predicts a fabrication process failure mode. As seen in the previous figure, vias adjacent to the large trenches etch faster due to larger local pattern density. In this structure, the faster etch rate causes these vias to punch through the etch stop layer 1001, creating the potential for an electrical short at the punch-through locations 1002.

Figure 11:
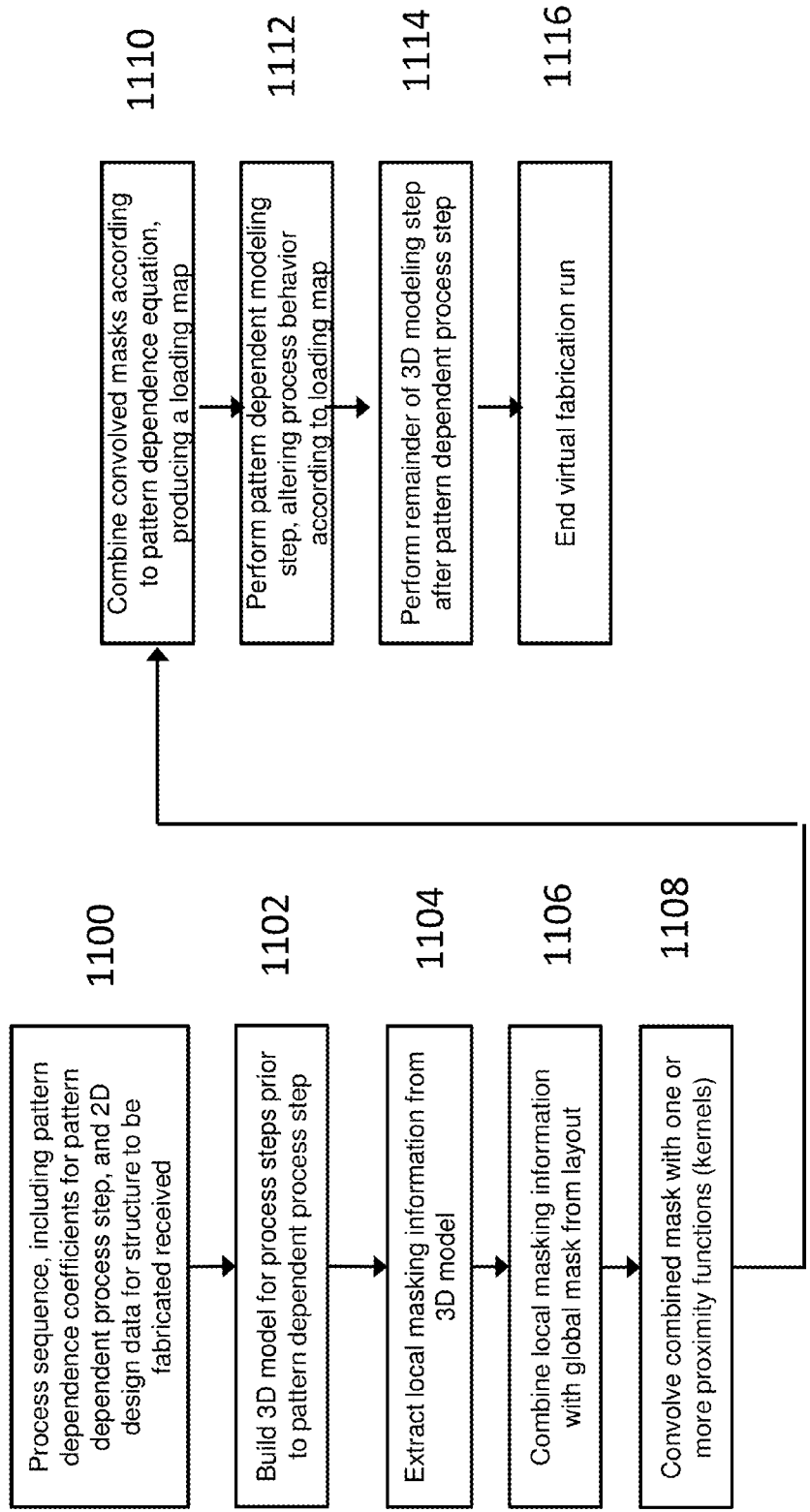
FIG. 11 depicts an exemplary sequence of steps followed by an embodiment of the present invention to include a pattern dependent modeling step in an embodiment of the present invention in which a combined local and global mask is convolved with at least one proximity function during a virtual fabrication run.

FIG. 11 depicts an exemplary sequence of steps followed by an embodiment of the present invention to include a pattern dependent modeling step in the process sequence for a virtual fabrication model build. The virtual fabrication run begins with a process sequence containing a pattern dependent step, the description of the pattern dependence step containing coefficients for the pattern dependence relation and indicating which design mask(s) should be used (step 1100). The virtual fabrication system follows the process sequence prior to the pattern dependent step, building the 3-D model representing the device structure prior to the pattern dependence (step 1102). The local mask is then extracted from the this 3-D model (1104, and is combined with the global mask (step 1106). The combined mask is convolved with one or more proximity functions to produce one or more convolved masks (1108), and the convolved masks are combined according to the pattern dependence relation to produce a loading map (1110). The pattern dependent process step is then modeled, using the loading map to alter the behavior of the process step as described above (step 1112). The fabrication steps following the pattern dependence step are then modeled (step 1114), resulting in the final complete 3-D device model (step 1116) that may more accurately predict the device structure. It will be appreciated that the information contained in the virtually fabricated 3-D device model may be the basis for later fabrication of the device in a physical fabrication environment.

In another embodiment, a single pattern dependent process step may be modeled in isolation rather than as part of a virtual fabrication sequence. In the same way that a virtual fabrication sequence provides valuable insight into physical device fabrication, a single virtual fabrication step provides valuable insight into the behavior of that single physical step (and in fact a virtual fabrication sequence is a sequence of individual virtual fabrication steps). Software tools which model individual process step are often called "unit process" modeling tools. Instead of using a 3-D model of a semiconductor device structure during a virtual fabrication run, the 3-D model from which the local mask is extracted for use by a unit process tool could be drawn manually by a user in a CAD program, come from measuring structures on a real wafer, come from some other virtual fabrication tool, or from any other source, as long as the 3-D model represents the device structure at the point immediately prior to the pattern dependent step in the fabrication process sequence of interest. With a 3-D structural model as input, the unit process tool follows a sequence identical to FIG. 11 from 1104 through 1112, with the goal of modeling a single pattern dependent process step.

Figure 12:
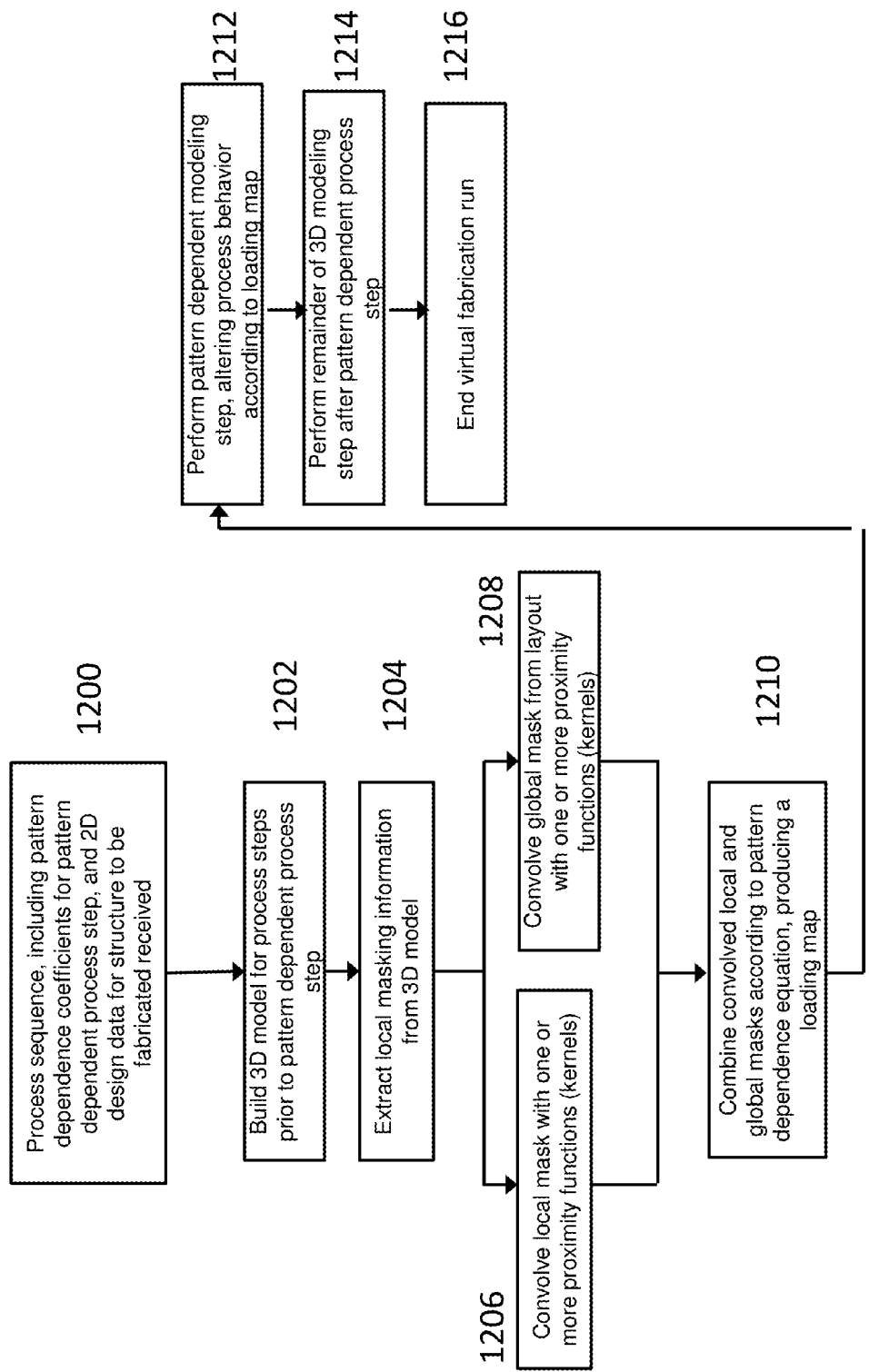
FIG. 12 depicts an alternative exemplary sequence of steps followed by an embodiment of the present invention to include a pattern dependent modeling step in an embodiment of the present invention in which proximity functions are individually convolved with local and global masks before the masks are combined during a virtual fabrication run.

FIG. 12 depicts an alternative exemplary sequence of steps followed by an embodiment of the present invention to include a pattern dependent modeling step in an embodiment of the present invention in which proximity functions are individually convolved with local and global masks before the masks are combined during a virtual fabrication run. The sequence begins similarly to the sequence of FIG. 11 with a process sequence containing a pattern dependent step and 2D design data for a device structure being received (step 1200), the construction of the 3-D model for process steps prior to the pattern dependent step (step 1202), and extraction of the local mask from the 3-D model (step 1204). In this alternative embodiment however, the local and global masks are separately convolved with one or more proximity functions, which may be the same or different for each mask (step 1206 and 1208), and the two convolved masks are combined according to the pattern dependence relation to create the loading map (step 1210). The pattern dependent process step is then modeled, using the loading map to alter the behavior of the process model (step 1212). The virtual fabrication sequence then finishes by modeling the process steps after the pattern dependent step (step 1214), resulting in the final complete 3-D device model (step 1216).

In another embodiment, a unit process tool uses a flow similar to FIG. 12 to model a single pattern dependent process step. With a 3-D model representing the device structure immediately prior to the pattern dependent process step as input, the unit process tool starts at 1204 and follows the sequence shown up to 1212.

Figure 13:
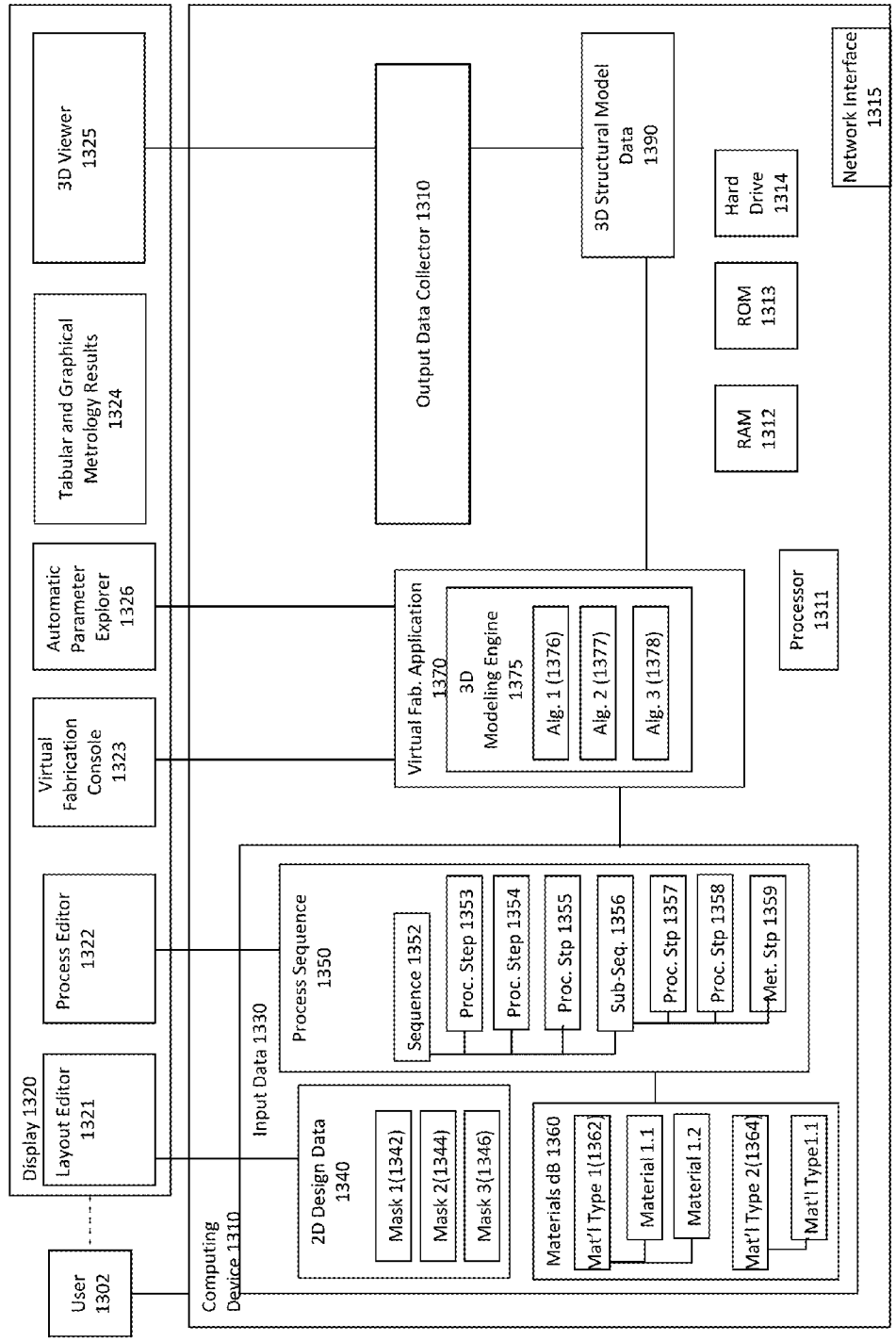
FIG. 13 depicts an exemplary virtual fabrication environment suitable for use with an embodiment of the present invention.

FIG. 13 depicts an exemplary virtual fabrication environment 1301 suitable for practicing an embodiment of the present invention. Virtual fabrication environment 1301 includes a computing device 1310 accessed by a user 1302. Computing device 1310 is in communication with a display 1320. Display 1320 may be a display screen that is part of computing device 1310 or may be a separate display device or display surface in communication with computing device 1310. Computing device 1310 may be a PC, laptop computer, tablet computing device, server, or some other type of computing device equipped with a processor 1311 and able to support the operations of 3-D modeling engine 1375 (described further below). The processor 1311 may have one or more cores. The computing device 1310 may also include volatile and non-volatile storage such as, but not limited to, Random Access Memory (RAM) 1312, Read Only Memory (ROM) 1313 and hard drive 1314. Computing device 1310 may also be equipped with a network interface 1315 so as to enable communication with other computing devices.

Computing device 1310 may store and execute virtual fabrication application 1370 including 3-D modeling engine 1375. 3-D modeling engine 1375 may include one or more algorithms such as algorithm 1 (1376), algorithm 2 (1377), and algorithm 3 (1378) used in virtually fabricating semiconductor device structures. 3-D modeling engine 1375 may accept input data 1330 in order to perform virtual fabrication "runs" that produce semiconductor device structural model data 1390. Virtual fabrication application 1370 and 3-D modeling engine 1375 may generate a number of user interfaces and views used to create and display the results of virtual fabrication runs. For example, virtual fabrication application 1370 and 3-D modeling engine 1375 may display layout editor 1321, process editor 1322 and virtual fabrication console 1323 used to create virtual fabrication runs. Virtual fabrication application 1370 and 3-D modeling engine 1375 may also display a tabular and graphical metrology results view 1324 and 3-D view 1325 for respectively displaying results of virtual fabrication runs and 3-D structural models generated by the 3-D modeling engine 1375 during virtual fabrication of semiconductor device structures.

Input data 1330 includes both 2D design data 1340 and process sequence 1350. Process sequence 1350 may be composed of multiple process steps 1353, 1354, 1355, 1356, 1357, 1358, and 1359. 2D design data 1340 includes of one or more layers such as mask 1 (1342), mask 2 (1344) and mask 3 (1346), typically provided in an industry-standard layout format such as GDS II (Graphical Design System version 2) or OASIS (Open Artwork System Interchange Standard).

Input data 1330 may also include a materials database 1360 including records of material types such as material type 1 (1362) and material type 2 (1364) and specific materials for each material type. Many of the process steps in a process sequence may refer to one or more materials in the materials database. Each material has a name and some attributes such as a rendering color. The materials database may be stored in a separate data structure. The materials database may have hierarchy, where materials may be grouped by types and sub-types. Individual steps in the process sequence may refer to an individual material or a parent material type. The hierarchy in the materials database enables a process sequence referencing the materials database to be modified more easily.

3-D Modeling Engine 1375 uses input data 1330 to perform the sequence of operations/steps specified by process sequence 1350. The performance of the process sequence 1350 during a virtual fabrication run generates 3-D structural model data 1390. 3-D structural model data 1390 may be used to generate a 3-D view of the structural model of the semiconductor device structure which may be displayed in the 3-D viewer 1325.

Portions or all of the embodiments of the present invention may be provided as one or more computer-readable programs or code embodied on or in one or more non-transitory mediums. The mediums may be, but are not limited to a hard disk, a compact disc, a digital versatile disc, a flash memory, a PROM, a RAM, a ROM, or a magnetic tape. In general, the computer-readable programs or code may be implemented in any computing language.

Since certain changes may be made without departing from the scope of the present invention, it is intended that all matter contained in the above description or shown in the accompanying drawings be interpreted as illustrative and not in a literal sense. Practitioners of the art will realize that the sequence of steps and architectures depicted in the figures may be altered without departing from the scope of the present invention and that the illustrations contained herein are singular examples of a multitude of possible depictions of the present invention.

The foregoing description of example embodiments of the invention provides illustration and description, but is not intended to be exhaustive or to limit the invention to the precise form disclosed. Modifications and variations are possible in light of the above teachings or may be acquired from practice of the invention. For example, while a series of acts has been described, the order of the acts may be modified in other implementations consistent with the principles of the invention. Further, non-dependent acts may be performed in parallel.

We claim:

1. A non-transitory computer-readable medium holding computer-executable instructions for identifying and modeling pattern dependent effects in a 3-D virtual semiconductor device fabrication environment provided by a computing device, the instructions when executed causing the computing device to:
generate a 2-D local mask from a 3-D model of a semiconductor device structure;
combine a global mask corresponding to 2D design layout data with the local mask to create a combined mask;
convolve at least one proximity function with the combined mask to create at least one convolved mask;
create a loading map using the at least one convolved mask, the loading map indicative of process behavior for a pattern dependent process step for virtual semiconductor device fabrication that varies as a result of one or more of pattern density, feature size or aspect ratio dependence; and
execute an algorithm to model the pattern dependent process step during virtual semiconductor device fabrication, a behavior of the algorithm altered based on the loading map.

2. The medium of claim 1 wherein the pattern dependent process step includes a pattern dependence relation that defines the loading map and the instructions when executed further cause the computing device to:
create a loading map by using the pattern dependence relation to combine the at least one convolved mask; and
use the loading map to modify the process behavior of the pattern dependent process step by scaling one or more nominal process parameters.

3. The medium of claim 1 wherein the pattern dependent process step is an etch process.

4. The medium of claim 3 wherein the etch process is a predictive multi-etch algorithm.

5. The medium of claim 1 wherein the process behavior is an etch rate that varies based on pattern density.

6. The medium of claim 1 wherein the process behavior is an etch profile that varies based on feature size.

7. The medium of claim 1 wherein the pattern dependent process step performs chemical mechanical polishing.

8. The medium of claim 1 wherein the pattern dependent process step performs deposition.

9. The medium of claim 1 wherein the at least one proximity function is a normalized two-dimensional Gaussian function.

10. The medium of claim 1 wherein the pattern dependent process step includes a pattern dependence relation that defines the loading map and wherein the pattern dependence relation is a linear combination of up to two proximity functions expressed as:

$$f(\vec{x}) = c_0 + c_1 p_1(r_1) * M(\vec{x}) + c_2 pc(r_2) * M(\vec{x})$$

where $c_0$, $c_1$, $c_2$ are constant coefficients chosen by the user, $r_1$, $r_2$ are proximity function radii chosen by the user, $p_1$ and $p_2$ are proximity functions, and M is the combined mask.

11. A non-transitory computer-readable medium holding computer-executable instructions for identifying and modeling pattern dependent effects in a 3-D virtual semiconductor device fabrication environment provided by a computing device, the instructions when executed causing the computing device to:
receive 2D design layout data and a fabrication process sequence for a semiconductor device structure, the fabrication process sequence including a pattern dependent process step, the pattern dependent process step including a pattern dependence relation;
build, during a virtual fabrication run to virtually fabricate the semiconductor device structure, a 3-D model of a semiconductor device structure by executing the process sequence up until the pattern dependent process step;
generate a 2-D local mask from a 3-D model of a semiconductor device structure built by executing the process sequence up until the pattern dependent process step;
convolve at least one proximity function with the local mask to create at least one convolved local mask;
convolve at least one proximity function with a global mask based on 2D design layout data to create at least one convolved global mask;
create a loading map using the convolved local and global masks, the loading map indicative of process behavior for a pattern dependent process step for virtual semiconductor device fabrication that varies as a result of one or more of pattern density, feature size or aspect ratio dependence;
execute an algorithm to model the pattern dependent process step during virtual semiconductor device fabrication, a behavior of the algorithm altered based on the loading map; and
execute a remainder of the process sequence following the pattern dependent process step to complete the build of the 3-D model of the semiconductor device structure.

12. The medium of claim 11 wherein the instructions when executed further cause the computing device to:
create a loading map by using the pattern dependence relation to combine the at least one convolved global mask and at least one convolved local mask; and
use the loading map to modify the process behavior of the pattern dependent process step by scaling one or more nominal process parameters.

13. A computer-implemented method for identifying and modeling pattern dependent effects in a 3-D virtual semiconductor device fabrication environment, comprising:
generating a 2-D local mask from a 3-D model of a semiconductor device structure;

combining a global mask corresponding to 2D design layout data with the local mask to create a combined mask;

convolving at least one proximity function with the combined mask to create at least one convolved mask;

creating a loading map using the at least one convolved mask, the loading map indicative of process behavior for a pattern dependent process step for virtual semiconductor device fabrication that varies as a result of one or more of pattern density, feature size or aspect ratio dependence; and executing an algorithm to model the pattern dependent process step during virtual semiconductor device fabrication, a behavior of the algorithm altered based on the loading map.

14. The method of claim 13, further comprising:

creating a loading map by using the pattern dependence relation to combine the at least one convolved mask; and using the loading map to modify the process behavior of the pattern dependent process step by scaling one or more nominal process parameters.

15. The method of claim 13 wherein the pattern dependent process step is an etch process.

16. The method of claim 15 wherein the etch process is a predictive multi-etch algorithm.

17. The method of claim 13 wherein the process behavior is an etch rate that varies based on pattern density.

18. The method of claim 13 wherein the process behavior is an etch profile that varies based on feature size.

19. The method of claim 13 wherein the pattern dependent process step performs chemical mechanical polishing.

20. The method of claim 13 wherein the pattern dependent process step performs deposition.

21. The method of claim 13 wherein the at least one proximity function is a normalized two-dimensional Gaussian function.

22. The method of claim 13 wherein the pattern dependent process step includes a pattern dependence relation that defines the loading map and wherein the pattern dependence relation is a linear combination of up to two proximity functions expressed as:

$$f(\vec{x}) = c_0 + c_1 p_1(r_1) * M(\vec{x}) + c_2 p_2(r_2) * M(\vec{x})$$

where $c_0$, $c_1$, $c_2$ are constant coefficients chosen by the user, $r_1$, $r_2$ are proximity function radii chosen by the user, $p_1$ and $p_2$ are proximity functions, and M is the combined mask.

23. A computer-implemented method for identifying and modeling pattern dependent effects in a 3-D virtual semiconductor device fabrication environment, comprising:

receiving 2D design layout data and a fabrication process sequence for a semiconductor device structure, the fabrication process sequence including a pattern dependent process step, the pattern dependent process step including a pattern dependence relation;

building, during a virtual fabrication run to virtually fabricate the semiconductor device structure, a 3-D model of a semiconductor device structure by executing the process sequence up until the pattern dependent process step;

generating a 2-D local mask from a 3-D model of a semiconductor device structure built by executing the process sequence up until the pattern dependent process step;

convolving at least one proximity function with the local mask to create at least one convolved local mask;

convolving one or more proximity functions with a global mask based on 2D design layout data to create at least one convolved global mask;

creating a loading map using the convolved local and global masks, the loading map indicative of process behavior for a pattern dependent process step for virtual semiconductor device fabrication that varies as a result of one or more of pattern density, feature size or aspect ratio dependence;

executing an algorithm to model the pattern dependent process step during virtual semiconductor device fabrication, a behavior of the algorithm altered based on the loading map; and executing a remainder of the process sequence following the pattern dependent process step to complete the build of the 3-D model of the semiconductor device structure.

24. The method of claim 23, further comprising:

creating a loading map by using the pattern dependence relation to combine the at least one convolved global mask and at least one convolved local mask; and using the loading map to modify the process behavior of the pattern dependent process step by scaling one or more nominal process parameters.

25. A computer-implemented method for identifying and modeling pattern dependent effects in a 3-D virtual semiconductor device fabrication environment, comprising:

receiving 2D design layout data and a fabrication process sequence for a semiconductor device structure, the fabrication process sequence including a pattern dependent process step, the pattern dependent process step including a pattern dependence relation;

building, during a virtual fabrication run to virtually fabricate the semiconductor device structure, a 3-D model of a semiconductor device structure by executing the process sequence up until the pattern dependent process step;

generating a 2-D local mask from the 3-D model of a semiconductor device structure built by executing the process sequence up until the pattern dependent process step;

combining a global mask corresponding to the 2D design layout data with the local mask to create a combined mask;

convolving at least one proximity function with the combined mask to create at least one convolved mask;

creating a loading map using the at least one convolved mask, the loading map indicative of process behavior for a pattern dependent process step for virtual semiconductor device fabrication that varies as a result of one or more of pattern density, feature size or aspect ratio dependence;

executing an algorithm to model the pattern dependent process step during virtual semiconductor device fabrication, a behavior of algorithm altered based on the loading map; and executing a remainder of the process sequence following the pattern dependent process step to complete the build of the 3-D model of the semiconductor device structure.

26. The method of claim 25, further comprising:

creating a loading map by using the pattern dependence relation to combine the at least one convolved mask; and using the loading map to modify the process behavior of the pattern dependent process step by scaling one or more nominal process parameters.

27. A non-transitory computer-readable medium holding computer-executable instructions for identifying and modeling pattern dependent effects in a 3-D virtual semiconductor device fabrication environment provided by a computing device, the instructions when executed causing the computing device to:

receive 2D design layout data and a fabrication process sequence for a semiconductor device structure, the fabrication process sequence including a pattern dependent process step, the pattern dependent process step including a pattern dependence relation;

build, during a virtual fabrication run to virtually fabricate the semiconductor device structure, a 3-D model of a semiconductor device structure by executing the process sequence up until the pattern dependent process step;

generate a 2-D local mask from the 3-D model of a semiconductor device structure built by executing the process sequence up until the pattern dependent process step;

combine a global mask corresponding to the 2D design layout data with the local mask to create a combined mask;

convolve at least one proximity function with the combined mask at least one convolved mask;

create a loading map using the at least one convolved mask, the loading map indicative of process behavior for a pattern dependent process step for virtual semiconductor device fabrication that varies as a result of one or more of pattern density, feature size or aspect ratio dependence;

execute an algorithm to model the pattern dependent process step during virtual semiconductor device fabrication, a behavior of the algorithm altered based on the loading map; and execute a remainder of the process sequence following the pattern dependent process step to complete the build of the 3-D model of the semiconductor device structure.

28. The medium of claim 27 wherein the instructions when executed further cause the computing device to:

create a loading map by using the pattern dependence relation to combine the at least one convolved mask; and use the loading map to modify the process behavior of the pattern dependent process step by scaling one or more nominal process parameters.

* * * * *